US005674574A

United States Patent [19]
Atwell et al.

[11] Patent Number: 5,674,574
[45] Date of Patent: Oct. 7, 1997

[54] VAPOR DELIVERY SYSTEM FOR SOLID PRECURSORS AND METHOD REGARDING SAME

[75] Inventors: David R. Atwell; Donald L. Westmoreland, both of Boise, Id.

[73] Assignee: Micron Technology, Inc., Boise, Id.

[21] Appl. No.: 650,743

[22] Filed: May 20, 1996

[51] Int. Cl.[6] ................................ C23C 16/00
[52] U.S. Cl. .................. 427/561; 427/595; 427/596; 427/248.1; 118/719; 118/726; 392/391
[58] Field of Search ................ 118/726, 719; 392/391; 427/561, 595, 596, 248.1

[56] References Cited

U.S. PATENT DOCUMENTS

| | | | |
|---|---|---|---|
| 4,585,624 | 4/1986 | Young | 392/391 |
| 4,658,115 | 4/1987 | Heath | 392/391 |
| 4,791,273 | 12/1988 | Satoh | 392/391 |
| 5,277,938 | 1/1994 | Wegmann et al. | 427/566 |
| 5,356,673 | 10/1994 | Schmitt | 118/726 |
| 5,384,289 | 1/1995 | Westmoreland | 437/245 |
| 5,405,659 | 4/1995 | Fernandez | 118/726 |
| 5,447,569 | 9/1995 | Hiskes et al. | 118/726 |
| 5,476,547 | 12/1995 | Mikoshiba | 118/726 |
| 5,529,634 | 6/1996 | Miyata | 118/726 |

Primary Examiner—Richard Bueker
Attorney, Agent, or Firm—Mueting, Raasch, Gebhardt & Schwappach, P.A.

[57] ABSTRACT

A vapor delivery system for vaporization and delivery of a solid precursor includes a housing having an inlet for receiving a carrier gas. A rotatable substrate surface is contained in the housing having a solid precursor material applied thereon. A focused thermal beam is positioned for impingement on the solid precursor material. A drive mechanism moves one of the rotatable surface and the focused thermal beam relative to the other such that with rotation of the rotatable substrate surface the focused thermal beam continuously impinges on a different contact area of the solid precursor material for vaporization thereof. The housing further has an outlet for transport of the vaporized precursor material therefrom. The rotatable surface may be a cylindrical surface or a circular platen surface. A CVD system having a vapor delivery system is also provided along with a device for use in the delivery system. A method for delivering the vaporized solid precursor to a CVD process chamber includes providing a surface having a solid precursor material applied thereon. A focused thermal beam is directed at the surface. The surface is rotated and one of the rotating surface and the focused thermal beam are indexed relative to the other such that the directed beam is repetitively moved from impinging upon one path of solid precursor material to a next path of solid precursor material to vaporize the solid precursor material on the surface. The vaporized solid precursor material is then transported to the process chamber.

40 Claims, 4 Drawing Sheets

VAPOR DELIVERY SYSTEM FOR SOLID PRECURSORS AND METHOD REGARDING SAME

FIELD OF THE INVENTION

The present invention pertains to chemical vapor deposition (CVD). More particularly, the present invention relates to delivery systems for vaporizing solid precursors and delivering vaporized solid precursors for semiconductor wafer CVD processes and also to methods regarding such vaporization and delivery.

BACKGROUND OF THE INVENTION

Chemical vapor deposition (CVD) has been extensively used for preparation of films and coatings in semiconductor wafer processing. CVD is a favored deposition process in many respects, for example, because of its ability to provide highly conformal and high quality films, at relatively fast processing times. Further, CVD is beneficial in coating substrates of irregular shapes including the provision of highly conformal films even with respect to deep contacts and other openings.

Metalorganic chemical vapor deposition (MOCVD), wherein organometallic precursors are utilized for depositing films, is highly dependant upon suitable organometallic precursors. Generally, gases or volatile liquid precursors are utilized for such processes as they can be easily delivered to the process as a vaporized material. Solid precursors are generally considered to be a poor choice due to the difficulty of vaporizing, i.e. subliming, a solid at a controlled rate. However, there are many off the shelf solid precursors available, particularly solid organometallic precursors, which if they could be delivered effectively and reproducibly, could be used for CVD processes. Some organometallic precursor compounds are described in U.S. Pat. No. 5,384,289 entitled "Reductive Elimination Chemical Vapor Deposition Processes Utilizing Organometallic Precursor Compounds in Semiconductor Wafer Processing" incorporated herein by reference. Further, for example, solid precursors are particularly useful in the deposition of metal based films, such as, for example, metal nitrides and metal silicides.

Standard CVD processes typically employ precursor sources in vaporization chambers that are separated from the process or reactor chamber wherein the deposition surface or wafer is located. Liquid precursors, are typically placed in bubblers and heated to a temperature at which they vaporize and the vaporized liquid precursor material is then transported by a carrier gas passing over the bubbler or through the liquid precursor. The vapors are swept through a gas line to the process or reactor chamber for depositing a CVD film on a heated substrate or wafer. Many techniques have been developed to precisely control this process and the amount of material transported to the process chamber can be precisely controlled by, for example, the temperature of the liquid precursor reservoir and by the flow of the carrier gas bubbled through or passed over the reservoir.

However, similar techniques for solid precursors are not adequate for providing a vaporized solid precursor suitable for depositing CVD films. For illustration, similar techniques may include bulk sublimation of the solid precursor with transport of the vaporized solid precursor to the process chamber using a carrier gas in much the same manner as the vaporized liquid precursor is transported. However, it is difficult to vaporize a solid at a controlled rate such that a reproducible flow of vaporized solid precursor can be delivered to the process chamber.

Lack of control of solid precursor sublimation is, at least in part, due to the changing surface area of the bulk solid precursor as it is vaporized. Such a changing surface area when the bulk solid precursor is exposed to sublimation temperatures produces a continuously changing rate of vaporization, particularly for thermally sensitive compounds. This ever changing rate of vaporization results in a continuously changing and nonreproducible flow of vaporized solid precursor delivered for deposition in the process chamber. As a result, film growth rate and composition of such films on wafers in the process chamber deposited using such vaporized solid precursors cannot be controlled adequately and effectively. Therefore, it is important to precisely control the exposure of the solid precursors to elevated temperatures, without bulk decomposition of the solid precursor material. Further, for example, many solid precursors, such as organometallic precursors, decompose slowly when held near their sublimation temperatures.

Therefore, there is a need in the art for a vapor delivery system for delivering solid CVD precursors, particularly thermally sensitive precursors, in a CVD process at a highly controllable rate and without bulk decomposition of the solid precursor material during vaporization. The present invention provides such a system and method overcoming such problems as described above and others that will be readily apparent to one skilled in the art from the description of the present invention below.

SUMMARY OF THE INVENTION

A vapor delivery system in accordance with the present invention for vaporization and delivery of a solid precursor includes a housing defining a sealed interior volume having an inlet for receiving a carrier gas. A rotatable substrate surface is contained in the housing having a solid precursor material applied thereon. A focused thermal beam is positioned for impingement on the solid precursor material. A drive mechanism moves one of the rotatable surface and the focused thermal beam relative to the other such that with rotation of the rotatable substrate surface the focused thermal beam continuously impinges on a different contact area of the solid precursor material for vaporization thereof. The housing has an outlet for transport of the vaporized precursor material using the carrier gas from the interior volume of the housing.

In one embodiment of the vapor delivery system, the rotatable surface is a cylindrical surface having a longitudinal axis therethrough. An additional drive mechanism rotates the cylindrical surface about the longitudinal axis. In further embodiments, the focused thermal beam is in a fixed position directed through a beam port in the housing and a drive mechanism moves the cylindrical surface linearly along the longitudinal axis. Alternatively, the focused thermal beam is not in a fixed position and the drive mechanism moves the focused thermal beam directed through a beam port in the housing linearly across the cylindrical surface in a direction common with the longitudinal axis.

In another embodiment of the vapor delivery system, the rotatable surface is a circular platen surface having a longitudinal axis through a center thereof. The system further includes an additional drive mechanism for rotating the circular platen surface about the longitudinal axis. Further, the focused thermal beam directed through a beam port is moved between an edge portion of the circular platen surface and the center of the circular platen surface.

A CVD system in accordance with the present invention having a vapor delivery system for delivering a vaporized solid precursor to a CVD process chamber includes a carrier gas source for providing a carrier gas and a housing defining a sealed interior volume having a carrier gas inlet for receiving the carrier gas from the carrier gas source. A rotatable member is positioned in the housing and the rotatable member has a surface with solid precursor material applied thereon. A first drive mechanism is connected to the rotatable member for rotating the surface about a longitudinal axis of the rotatable member. A thermal source is positioned for directing a focused thermal beam through a beam port of the housing for impingement on the solid precursor material. The vapor delivery system of the CVD system further includes a second drive mechanism for moving one of the rotatable member and the focused beam relative to the other such that with rotation of the rotatable surface the focused beam continuously impinges on a different contact area of the solid precursor material for vaporization thereof. The housing further includes a carrier gas outlet for transport of the vaporized precursor material from the interior volume of the housing to the process chamber.

A device of the present invention for use in a delivery system for delivering vaporized solid precursor material to a CVD process chamber is also described. The delivery system includes a focused thermal beam directed on the device. The device includes a substrate having a surface with solid precursor material applied thereon such that, when the device is rotated, the focused thermal beam directed thereon impinges on a pattern of the solid precursor material. The pattern of the solid precursor material includes areas of solid precursor material separated by areas of substrate material.

In one embodiment or the device in accordance of the present invention, the pattern is sized as a function of the focused thermal beam. In other embodiments of the device, the surface is a cylindrical surface having a longitudinal axis therethrough for rotation thereabout or the surface may be a circular platen surface having a longitudinal axis through a center thereof for rotation thereabout.

A method in accordance with the present invention for delivering a vaporized solid precursor to a CVD process chamber includes providing a surface having a solid precursor material applied thereon. A focused thermal beam is directed at the surface. The surface is rotated and one of the rotating surface and the focused thermal beam are indexed relative to the other such that the directed beam is repetitively moved from impinging upon one path of solid precursor material to a next path of solid precursor material to vaporize the solid precursor material on the surface. The vaporized solid precursor material is then transported to the process chamber.

In one embodiment of the method, the surface is a cylindrical surface rotated about a longitudinal axis therethrough with the paths extending about the longitudinal axis. The indexing step of the method then includes indexing the cylindrical surface linearly along the longitudinal axis. Alternatively, the indexing step may include indexing the focused thermal beam linearly across the cylindrical surface in a direction common with the longitudinal axis.

In another embodiment of the method, the surface is a circular platen surface rotated about a longitudinal axis through a center thereof. The indexing step, then includes indexing the focused beam between an edge of the platen surface and the center of the circular platen surface.

In another embodiment of the method, the surface having a solid precursor material applied thereon is provided by making a solution of a solid precursor and a solvent, coating the surface with the solution, and removing the solvent from the solution coated on the surface. Alternatively, the surface of solid precursor material may be provided by sublimation of the solid precursor material and then condensation of the solid precursor material on the surface.

DETAILED DESCRIPTION OF THE EMBODIMENTS

Generally, the vapor delivery systems described herein utilize a suitable solid precursor material applied or attached to a substrate. For example, the substrate may be a cylinder or a platen or any other suitable shape. The solid precursor material applied to the surface is uniform in thickness. The surface is rotated at a predetermined speed and a focused thermal beam, for example, a laser beam, is focused on the substrate surface. The beam and substrate surface are moved relative to one another at a predetermined speed as the substrate surface is rotated such that the laser beam continuously impinges on a different contact area of the solid precursor material for vaporization thereof. The laser beam is used to rapidly heat and vaporize the precursor at the point of contact or contact area while the bulk of the solid precursor material remains unheated or chilled. The vaporization continues until the desired amount of solid precursor material on the substrate surface is vaporized. The vapor delivery systems of the present invention allow the user to vaporize a known amount of precursor and achieve continuous uninterrupted delivery of the vaporized solid precursor to the process chamber in reproducible fashion. Once the vaporized solid precursor material is delivered to the CVD process chamber, it is used for material deposition performed using established CVD processes as is readily known to one skilled in the art.

Figure 1:
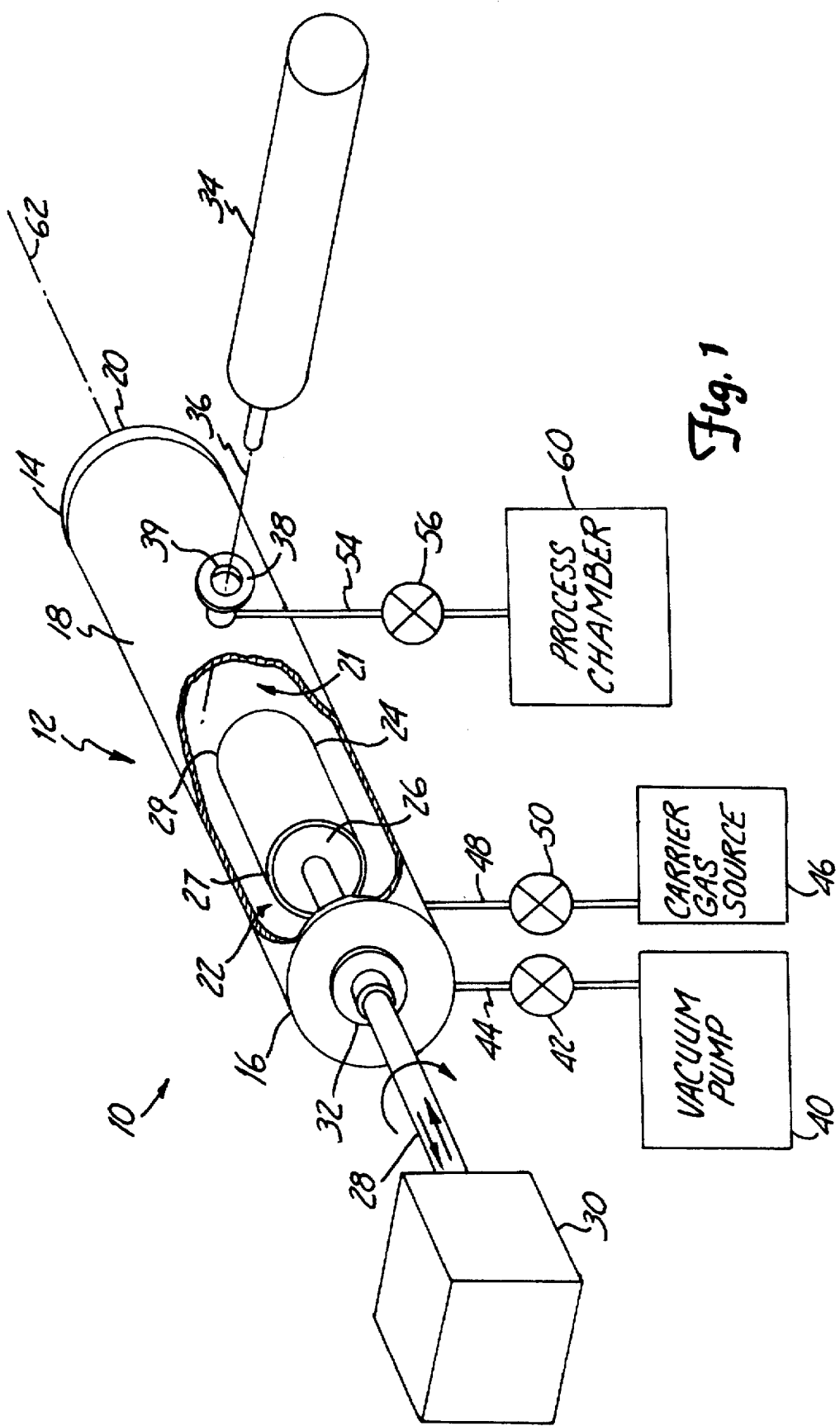
FIG. 1 is a perspective, partially cutaway, view of a vapor delivery system for solid precursor material in accordance with the present invention.
Figure 2:
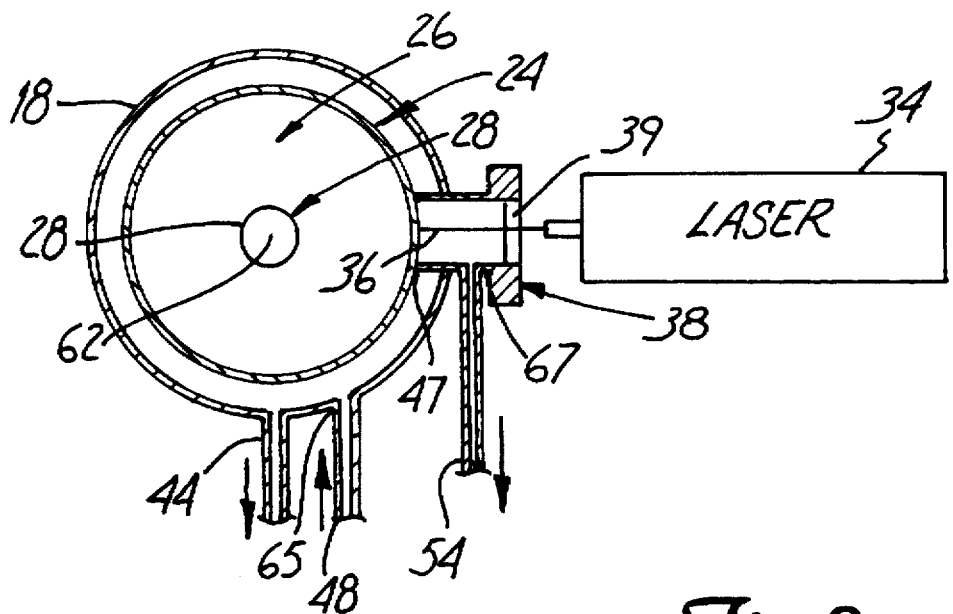
FIG. 2 is a cross-sectional view of the vapor delivery system of FIG. 1 taken along a line at the center of the view or beam port of the vapor delivery system.

A vapor delivery system 10 in accordance with the present invention shall be described with reference to FIGS. 1 and 2. The vapor delivery system 10 for delivering solid CVD precursors to a process chamber 60 includes a heated vacuum chamber 12. The heated vacuum chamber 12 is formed of a housing body 18 of cylindrical shape. The heated vacuum chamber 12 further includes a first end 14 having an access door 20 for access to the interior sealed volume 21 within the heated vacuum chamber 12. The access door 20, in addition to being used for positioning solid precursor surface device 22 in the vacuum chamber, may also be used, for example, in purging the chamber. The heated vacuum chamber 12 further includes second end 16.

Positioned within the heated vacuum chamber 12 is the solid precursor surface device 22. Solid precursor surface device 22 includes a cylindrically shaped substrate 26 having solid precursor material 24 applied thereto as described further below. The cylindrical substrate 26 is connected to a motor and drive mechanism 30 by a cylindrical shaft 28 through a rotary linear feed through 32 in the second end 16 of the heated vacuum chamber 12.

The motor and drive mechanism 30 is for rotation of the cylindrical shaft 28 and thus rotation of the cylindrical substrate 26 and solid precursor material 24 applied thereon about longitudinal axis 62. Further, the motor and drive mechanism 30 is utilized for indexing and linearly moving cylindrical shaft 28 and thus cylindrical substrate 26 along axis 62 within the heated vacuum chamber 12.

The cylindrical substrate 26 and cylindrical shaft 28 include internal gas or liquid cooling. Such internal gas or liquid cooling provides control of the vaporization process such that the bulk of the solid precursor material 24 applied on the cylindrical substrate 26 is cooled and only a point of contact by a laser beam 36 as described below is heated. The heat is therefore focused at the particular point of contact of the laser beam 36 and thus, decomposition of surrounding precursor material cooled is prevented.

The vapor delivery system 10 further includes laser source 34 for directing a laser beam 36 on the solid precursor material 24. The laser source 34 is fixedly positioned for directing the laser beam 36 through the beam port 38. The beam port 38 has a window 39 position therein. The laser may be any device capable of focusing a thermal beam at a particular point of contact on the solid precursor material 24. For example, the laser may be an infrared (IR) laser or a focused high intensity lamp. Further, the focused thermal beam may be achieved by any other known source which can achieve vaporization temperatures at the point of contact at the solid precursor material 24.

The window 39 of the beam port 38 is an IR transparent window, if utilized with an IR laser. The window may be formed of an IR transparent material such as, for example, NaCl or CsI. Further, the window 39 may be positioned or mounted in the beam port 38 such that it can be readily changeable. For example, the window may be slid into the view port and a sealing material may be utilized around the window to seal the area. As the window will likely have solid precursor material 24 deposited thereon over time and throughout the delivery process, the quick change window allows the window to be changed easily, perhaps at the same time as a new solid precursor surface device 22 is positioned within the heated vacuum chamber 12. Further, the window may be gas purged to prevent such deposition from occurring. For example, a gas line could be positioned in a wall of the beam port in close proximity to the window to allow for performance of the purging.

The vapor delivery system 10 further includes a vacuum pump 40 and a pump valve 42 in line 44 having an outlet from the heated vacuum chamber 12. The vacuum pump 40 and pump valve 42 are utilized to evacuate the heated vacuum chamber 12.

The housing body 18 of the heated vacuum chamber 12 includes an inlet 65 for receiving the carrier gas through heated gas lines 48 under control of the carrier gas source 46 and gas valve 50. An outlet 67 is positioned in close proximity to the point of contact at which the laser beam 36 impinges upon the solid precursor material 24 for transporting the vaporized solid precursor material carried by the carrier gas to the process chamber 60 by way of heated gas lines 54 and process chamber valve 56. The carrier gas may be any inert gas, such as, for example, nitrogen, helium or argon, and further may be preheated. The heated gas lines 54 may include heated double walled stainless steel tubing from the heated vacuum chamber 12 to the process chamber 60. The heated gas lines 54 may be any lines suitable for allowing the vaporized precursor material to remain activated until it gets to the process chamber 60.

The beam port 38 includes a wall 47 extending through the housing body 18 to a position in close proximity to the solid precursor material 24. By having the beam port extend within the housing body 18, heat is further prevented from spreading to areas other than the point of contact. With the outlet 67 and beam 36 positioned in close proximity to the point of contact, and with the wall 47 and heated gas lines 54 which provide direction to the vaporized solid precursor material, the vaporized solid precursor is transported effectively thought the heated gas lines 54 to the process chamber 60.

The solid precursor material 24 applied on the cylindrical substrate 26 of the solid precursor surface device 22 may be any solid material that is to be delivered in vaporized form in a CVD process or any solid material that will sublime. For example, such solid precursor materials may include cyclopentadienyl cycloheptatrienyl titanium or dicyclooctatetraene titanium, such as for the deposition of metal nitrides, or other metal based films. The present invention is applicable to any solid precursor material to be delivered in a CVD process and is not limited to any particular material described herein but limited only as described in the accompanying claims.

The substrate, for example, the cylindrical substrate 26, upon which the solid precursor material is applied, may be constructed of materials such as, for example, alumina, glass, quartz, or any generally machinable ceramic. The substrate material should preferably have good heat transfer capabilities for cooling the solid precursor material 24.

The process of preparing the solid precursor surface device 22 or in other words applying the solid precursor material 24 to the cylindrical substrate 26 may be performed in various ways. The substrate 26 may be cooled. The solid precursor material may then be placed in a chamber and brought to its sublimation temperature and pressure for vaporization of the solid precursor material. The vaporized precursor material is then allowed to condense on the cooled substrate surface.

Alternatively, the method of preparing a solid precursor surface device 22 may include making a solution of the solid precursor material in a volatile solvent, for example, such as the solid precursors cyclopentadienyl cycloheptatrienyl titanium or dicyclooctatetraene titanium making a solution with tetrahydrofuran. The solution, depending upon its viscosity, may then be sprayed on the substrate surface, for example, electrostatically; the substrate surface may be dipped in the solution and then withdrawn slowly; the solution may be spin coated on the substrate surface; or the surface may be coated with the solution in any other known manner. The solvent is removed from the solution coated on the surface, such as by, for example, allowing it to evaporate leaving a uniform coating of precursor material 24 on the substrate surface or by baking the substrate to remove the solvent. Further, the solid precursor material 24 may be pressed on the substrate surface.

Each of the above processes for preparing the solid precursor surface device 22 may be repeated numerous times to achieve a desired thickness. The desired thickness may be utilized in controlling the delivery rate of the vaporized solid precursor material to the process chamber 60. Further, with respect to each of the above processes, the substrate surface, such as, for example, the surface of the cylindrical substrate 26 may be roughened for increased adhesion with the solid precursor material 24. For example, the quartz may be dipped in an HF solution to roughen the quartz surface. Further, surfaces may be roughened with an abrasive compound or in any other manner known to one skilled in the art.

Figure 3:
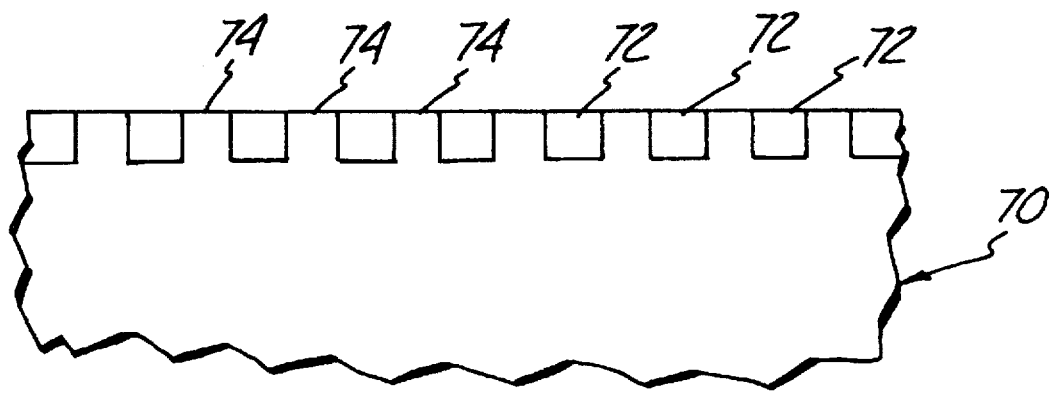
FIG. 3 is a cross-sectional view of an alternative solid precursor surface in accordance with the present invention.

In the alternative to having the entire cylindrical substrate surface 26 being coated with the solid precursor material 24, the substrate and solid precursor material 24 thereon may be formed as shown in FIG. 3. The substrate 70 may have a plurality of regions, or grooves 72 formed at the surface thereof by substrate projections 74. The regions or grooves 72 are then deposited with solid precursor material 24. The same methods as described above for applying the solid precursor material 24 to the cylindrical substrate 26 may be utilized to fill the grooves 72 and further, the surface may be planarized to create a uniform amount of precursor material 24 within the grooves. For example, the substrate material may be planarized to the top of substrate projection 74. As a result of this configuration, equivalent amounts of solid precursor material are deposited in the grooves 72. With the grooves 72 sized as a function of laser beam 36, the solid precursor material 24 may be vaporized by directing the beam 36 at the groove 72 to vaporize the solid precursor material 24 therein. With the grooves 72 separated by the substrate projections 74, heat is even further substantially fixed at the point of contact in the groove 72 and the bulk of the precursor material in areas adjacent thereto is not heated.

In the method of the present invention for delivering a vaporized solid precursor material to process chamber 60 with vapor delivery system 10, the solid precursor surface device 22 is positioned within the heated vacuum chamber 12. The solid precursor surface device 22 includes the solid precursor material 24 applied thereon.

The solid precursor surface device 22 defines paths, substantially circular paths, about longitudinal axis 62 extending therethrough. These paths are the paths of solid precursor material upon which the laser beam 36 impinges upon as the cylindrical shaft 28 is rotated about the longitudinal axis 62 and as the cylindrical shaft 28 is indexed for moving the cylindrical substrate along the longitudinal axis 62. The cylindrical substrate 27, is rotated at a predetermined speed and the laser beam 36 is focused at a point of contact on the surface of solid precursor material 24. The beam 36 is then moved at a predetermined speed down the length of the solid precursor material 24 on the cylindrical substrate 27 between the first end 27 and the second end 29 thereof.

Therefore, as the motor and drive mechanism 30 rotates the cylindrical shaft 28 at a predetermined speed about longitudinal axis 62, the laser beam 36 continuously impinges upon a different area of solid precursor material 24 along a substantially circular path of the solid precursor material 24 on the cylindrical substrate 26 about the longitudinal axis 62. After the cylindrical substrate 26 makes a complete revolution, the cylindrical substrate is indexed along the horizontal axis 62 such that the next path of solid precursor material 24 is impinged upon. The focused laser beam vaporizes only a small area of the solid precursor surface and the bulk of the solid precursor material is left inactivated.

The flow of the vaporization and delivery of vaporized solid precursor material 24 to the process chamber 60, can be controlled by the power of the laser beam 36 and how fast the cylindrical substrate is rotated. Further, as previously indicated, the thickness of the solid precursor material 24 on the precursor substrate can also be varied to change the flow rate. The lack of bulk decomposition of the solid precursor material 24 and uniformity of the solid precursor material 24 on the substrate 27 provides for, at least in part, the reproducibility of the process.

Prior to the vaporization of the solid precursor material 24, the heated vacuum chamber 12 is evacuated using vacuum pump 40 and pump valve 42 positioned in line 44. Further, the carrier gas is provided for transport of the vaporized solid precursor material 24 from the heated vacuum chamber 12 through outlet 67 and to process chamber 60.

It should be readily apparent to one skilled in the art that the deposition rate in process chamber 60 may be controlled by control of the vaporization of the solid precursor material 24. Such vaporization of the solid precursor material is highly dependant upon the solid precursor material utilized and the deposited film desired. Therefore, parameters such as the flow rate of carrier gas, rotation speed of the cylindrical substrate 26, indexing rate along longitudinal axis 62, as well as the power of laser beam 36 and any other parameters regarding the vaporization process will vary according to the specific application of the delivery system.

Further, it should be readily apparent to one skilled in the art, that the cylindrical shaft may be moved by the motor and drive mechanism 30 such that the cylindrical substrate 26 is angularly indexed about the axis 62 and the cylindrical shaft 28 is moved to allow impingement of the laser beam along linear paths between the first end 27 and the second end 29 prior to the angular indexing about axis 62. In other words, the laser beam may impinge on the solid precursor material 24 at second end 29 and the linear motion of the cylindrical substrate 27 along the axis 62 provides for impingement of the beam along the length of the cylindrical substrate 26. When the beam reaches the first end 26, the cylindrical substrate 26 would be angularly indexed by motor and drive mechanism 30 for impingement of the laser beam 36 on another row of solid precursor material 24. The cylindrical substrate 26 would then be moved by motor and drive mechanism 30 such that the laser beam would impinge upon the next row of solid precursor material 24. This is described as an alternative to rotating the cylindrical substrate such that a circular path of solid precursor material is impinged upon about the longitudinal axis 62 and then indexing the cylindrical substrate 26 linearly such that the laser beam 36 impinges upon a subsequent circular path of solid precursor material 24 about axis 62.

Figure 4:
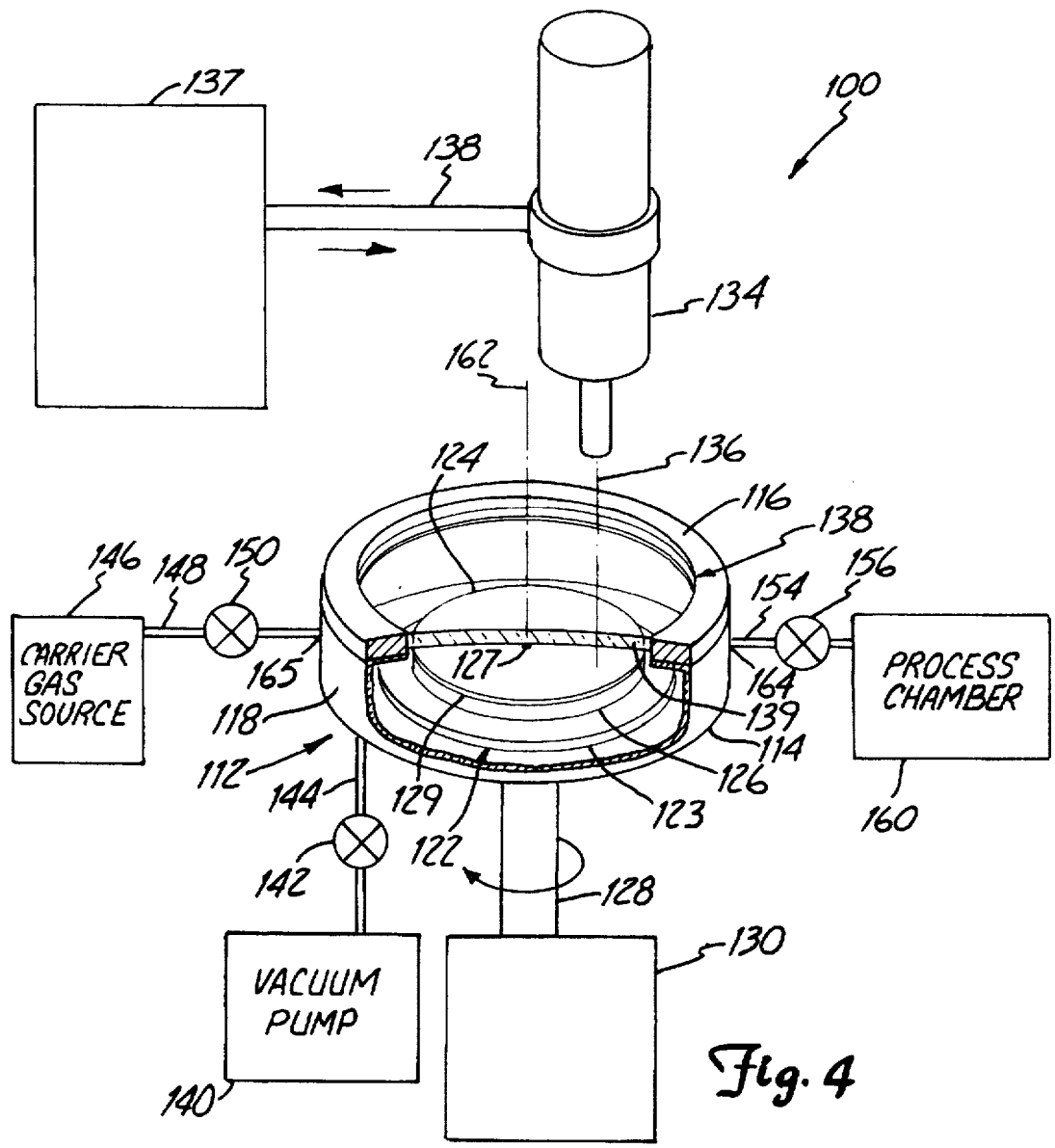
FIG. 4 is a perspective, partially cutaway, view of an alternative vapor delivery system for solid precursors in accordance with the present invention.

An alternative vapor delivery system 100 in accordance with the present invention shall be described with reference to FIG. 4. The vapor delivery system 100 for delivering a vaporized solid precursor to process chamber 160 includes a housing body 118 of cylindrical shape having a first end 116 designed as an access door for access to the interior of the heated vacuum chamber 112. The heated vacuum chamber 112 further includes a second end 114.

Positioned in the heated vacuum chamber 112 is a solid precursor surface device 122. The solid precursor surface device 122 includes a pedestal 123 having internal gas or liquid cooling. The pedestal 123 is coupled by pedestal shaft 128, which also may have internal gas or liquid cooling, to motor and drive mechanism 130. The solid precursor surface device 122 is coupled to the motor and drive mechanism 130 through a rotary feed through (not shown). The motor and drive mechanism 130 provides for rotation of the solid precursor material 124 applied on the circular platen substrate 126 about longitudinal axis 162 which extends through the center 127 of the circular platen 126.

The vapor delivery system 100 further includes a laser 134 for directing a laser beam 136 through a view port or a beam port 138 having a window 139 mounted therein. The configuration of the window may either be a large circular window as shown in FIG. 4 or, may be a slot window allowing the laser beam 136 to be moved from an edge 129 of the circular platen 126 to the center 127 thereof. The laser 134 is connected to a motor and drive mechanism 137 by support arm 138 which holds the laser 134. The motor and drive mechanism 137 controls the horizontal motion of the laser beam 136 between the edge of the circular platen 126 and the center 127 thereof.

The vapor delivery system 100 further includes a vacuum pump 140 which provides for evacuation of the heated vacuum chamber 112 utilizing vacuum pump valve 142 positioned in line 144. Further, a gas source 146 provides a carrier gas to the heated vacuum chamber 112 by means of gas valve 150 positioned in the heated gas line 148. The carrier gas is received in the heated vacuum chamber 112 at inlet 165. The carrier gas is then transported out of the heated vacuum chamber 112 at outlet 164 after mixing with the solid precursor material 124 vaporized in accordance with the present invention. The carrier gas transports the vaporized precursor material through heated line 154 by way of process chamber valve 156 to the process chamber 160 of a CVD process system.

The elements of the vapor delivery system 100 are formed of materials substantially similar to those elements as described with respect to the vapor delivery system 10. One skilled in the art would readily recognize that many of the components of the vapor deliver system 100, and also the vapor delivery system 10, may be constructed of readily known and readily available components. For example, various types of motor and drive mechanisms are readily available to provide the function as illustrated generally in the figures.

The method in accordance with the present invention utilizing the vapor delivery system 100 includes positioning the circular platen 126 having the solid precursor material 124 applied thereon in the heated vacuum chamber 112. The longitudinal axis 162 runs through the center 127 of the circular platen 126. The solid precursor material 124 applied on the circular platen 126 is rotated at a predetermined speed utilizing the motor and drive mechanism 130 such that the laser beam 136 impinges upon and vaporized the solid precursor material lying in a circular path about longitudinal axis 162. After one complete revolution of the circular platen 126, the motor and drive mechanism 137 moves or indexes the laser beam 138 between the edge 129 of the solid precursor material 124 and the center 127 thereof. As such, with the rotation of the circular platen 126, the laser beam 126 then vaporizes another circular path of solid precursor material 124 on the circular platen 126. The process is repeated until the desired amount of solid precursor material 124 is vaporized. The laser may be initialized at the center 127 of the solid precursor material 124, at the edge 129 of the solid precursor material 124, or anywhere therebetween. The vaporized solid precursor material is then transported by the carrier gas from carrier gas source 146 that is received in the heated vacuum chamber 112 at inlet 165 and is transported out of the heated vacuum chamber 112 by outlet 164 via process chamber heated line 154 and process chamber valve 156 to the process chamber 160.

Alternatively, the circular platen 126 can be angularly indexed at a predetermined speed with the laser beam sliding between the edge 129 of the precursor material 124 and the center 127 thereof. In other words, the laser 166 may be initialized at the edge 129 and moved by motor and drive mechanism 137 to the center 127 of the solid precursor material 124. After this line of solid precursor material 124 from the edge to the center has been vaporized, the circular platen would be angularly indexed by motor and drive mechanism 130 and the laser 136 would then be moved from the center 127 back to the edge 129. This process then would be repeated until the desired amount of solid precursor material 124 is vaporized.

As one skilled in the art will recognized, the manner of controlling the vaporization utilizing the vapor delivery system 10 are equally applicable to the vapor delivery system 100, such as, for example, increasing the thickness of the solid precursor material or adjusting the power of the laser.

Figure 5:
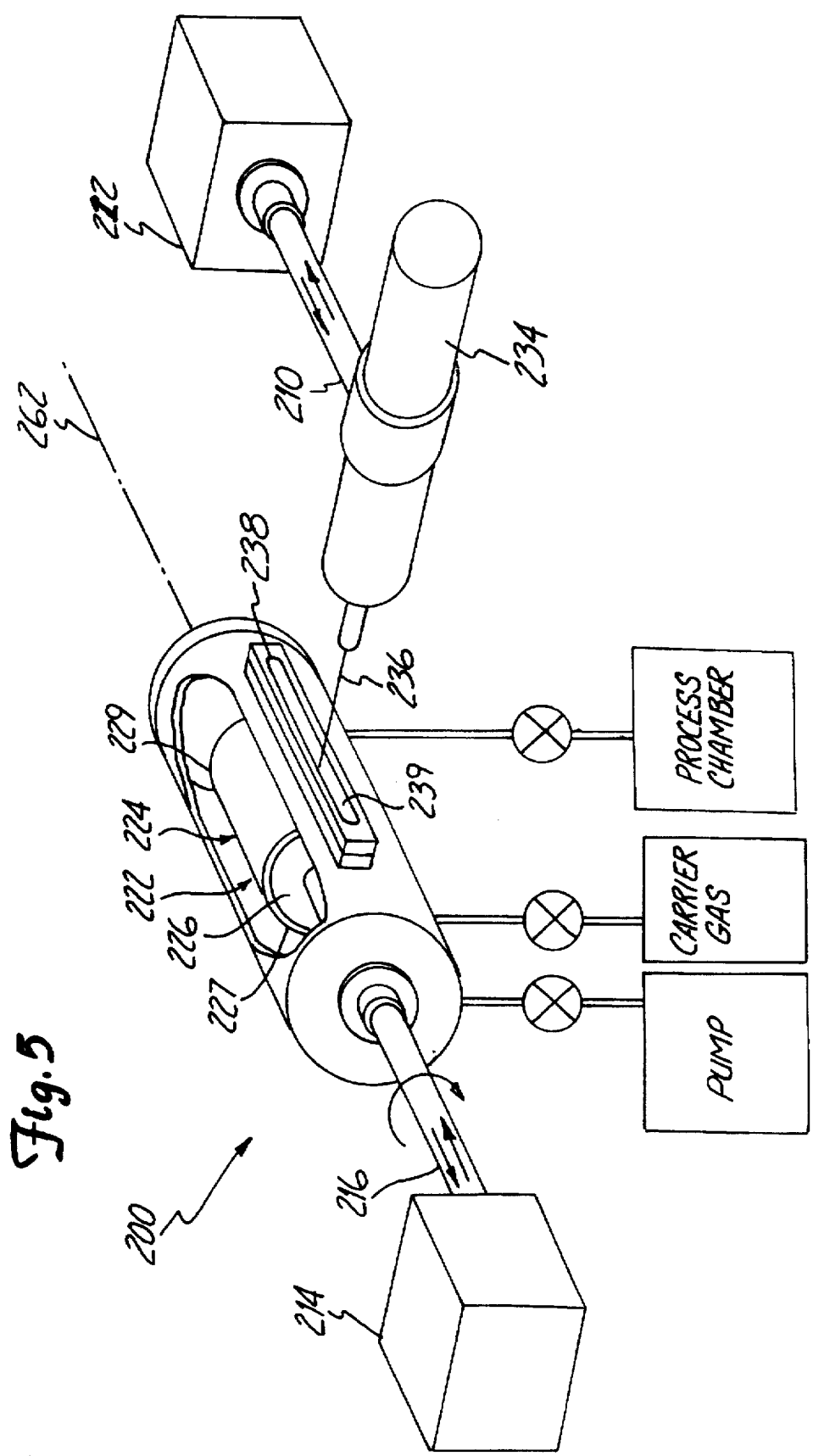
FIG. 5 is a further perspective, partially cutaway, view of an alternative vapor delivery system for solid precursors in accordance with the present invention.

Yet another alternative vapor delivery system 200 shall be described with reference to FIG. 5. The alternative vapor delivery system 200 in accordance with the present invention is substantially similar to the vapor delivery system 10 shown in FIG. 1. However, the vapor delivery system 200 includes an additional motor and drive mechanism 212 and includes a slot shaped view or beam port 238 having a transparent window 239 therein. The laser 234 focuses the laser beam 236 through the transparent window 239 to impinge on the solid precursor material 224.

With the addition of the slot shaped window 238 and the motor and drive mechanism 212 for moving the laser beam 236 between a first end 226 of the solid precursor material 224 to a second end 229 of the solid precursor material 224, the method of delivering the vaporized precursor material may be performed in a number of different manners. First, the laser beam 236 can be indexed in a direction common with the longitudinal axis 262 as the solid precursor surface device 222 is rotated such that the laser beam 236 continuously impinges upon a different point of contact along circular paths of the solid precursor material 224 about longitudinal axis 262. Second, the solid precursor surface device 222 can be angularly indexed as the laser beam 236 is moved along a line of solid precursor material 224 such that rows of the solid precursor material 224 are continuously vaporized during the vaporization process. Alternatively, the laser beam 236 may be held in a fixed position and the methods would be the same as described above with respect to FIGS. 1 and 2.

Although the invention has been described with particular reference to a preferred embodiment thereof, variations and modifications of the present invention can be made within a contemplated scope of the following claims as is readily known to one skilled in the art.

What is claimed is:

1. A vapor delivery system for a solid precursor, comprising:

a housing defining a sealed interior volume having an inlet for receiving a carrier gas;

a rotatable substrate surface contained in the housing having a solid precursor material applied thereon;

a focused thermal beam positioned for impingement on the solid precursor material;

a drive mechanism for moving one of the rotatable surface and focused thermal beam relative to the other such that with rotation of the rotatable surface the focused thermal beam continuously impinges on a different contact area of the solid precursor material for vaporization thereof, the housing having an outlet for transport of the vaporized precursor material using the carrier gas from the interior volume of the housing.

2. The system according to claim 1, wherein the rotatable substrate surface is a cylindrical surface having a longitudinal axis therethrough, the system further including an additional drive mechanism for rotating the cylindrical surface about the longitudinal axis.

3. The system according to claim 2, wherein the focused thermal beam is in a fixed position directed through a beam port in the housing, and further wherein the drive mechanism moves the cylindrical surface linearly along the longitudinal axis.

4. The system according to claim 2, wherein the drive mechanism moves the focused thermal beam directed through a beam port in the housing linearly across the cylindrical surface in a direction common with the longitudinal axis.

5. The system according to claim 1, wherein the solid precursor material applied is a substantially uniform layer of precursor material.

6. The system according to claim 1, wherein the rotatable substrate surface includes a cooled substrate.

7. The system according to claim 1, wherein the rotatable substrate surface is a circular platen surface having a longitudinal axis through a center thereof, the system further including an additional drive mechanism for rotating the circular platen surface about the longitudinal axis.

8. The system according to claim 7, wherein the drive mechanism moves the focused thermal beam directed through a beam port in the housing between an edge of the circular platen surface and the center of the circular platen surface.

9. The system according to claim 1, wherein the focused thermal beam is an infrared laser beam and further wherein the housing includes a beam port having an infrared transparent window through which the infrared laser beam is directed, the outlet port being positioned in close proximity to the infrared transparent window.

10. The system according to claim 1, wherein the housing includes a beam port having a transparent window through which the focused thermal beam is directed, the transparent window including means for quick replacement of the window.

11. The system according to claim 1, wherein the housing includes a beam port having a window through which the focused thermal beam is directed, the window being gas purged to prevent deposition on the window.

12. The system according to claim 1, wherein the solid precursor material is contained in first regions at the surface of the rotatable substrate surface which are separated by second regions of substrate material.

13. The system according to claim 12, wherein the first regions are sized as a function of the focused thermal beam.

14. A CVD system having a vapor delivery system for delivering a vaporized solid precursor to a CVD processing chamber, comprising:
  a carrier gas source for providing a carrier gas;
  a housing defining a sealed interior volume having a carrier gas inlet for receiving the carrier gas from the carrier gas source;
  a rotatable member positioned in the interior volume of the housing, the rotatable member including a surface having a solid precursor material applied thereon;
  a first drive mechanism connected to the rotatable member for rotating the surface about a longitudinal axis of the rotatable member;
  a thermal source positioned for directing a focused thermal beam through a beam port of the housing for impingement on the solid precursor material; and
  a second drive mechanism for moving one of the rotatable member and focused beam relative to the other such that with rotation of the rotatable member surface the focused beam continuously impinges on a different contact area of the solid precursor material for vaporization thereof, the housing having a carrier gas outlet for transport of the vaporized precursor material from the interior volume of the housing to the processing chamber.

15. The system according to claim 14, wherein the rotatable member is a cylinder with a cylindrical surface having the solid precursor material thereon and with the longitudinal axis extending from a first end thereof to a second end thereof, and further wherein the focused beam is in a fixed position directed through the beam port in the housing and the second drive mechanism moves the cylindrical surface linearly along the longitudinal axis.

16. The system according to claim 14, wherein the rotatable member is a cylinder with a cylindrical surface having the solid precursor material thereon and with the longitudinal axis extending from a first end thereof to a second end thereof, and further wherein the focused beam is moved between the first end of the cylinder and the second end of the cylinder by the second drive mechanism.

17. The system according to claim 14, wherein the rotatable member is a platen with the surface having solid precursor material thereon and with the longitudinal axis extending through the center of the platen, and further wherein the second drive mechanism moves the focused beam between an outer edge portion of the platen and the center of the platen.

18. A device for use in a delivery system for delivering vaporized solid precursor to a CVD process chamber, the delivery system including directing a focused thermal beam on the device, the device comprising a substrate having a surface with solid precursor material applied thereon such that, when the device is rotated, the focused thermal beam directed thereon impinges on a pattern of the solid precursor material, wherein the pattern of the solid precursor material includes areas of solid precursor material separated by areas of substrate material.

19. The device according to claim 18, wherein the focused thermal beam is generated from a focused high intensity lamp.

20. The device according to claim 18, wherein the focused thermal beam is an IR laser beam.

21. The device according to claim 18, wherein the pattern is circular and sized as a function of the focused laser beam.

22. The device according to claim 18, wherein the surface is a cylindrical surface having a longitudinal axis therethrough for rotation thereabout.

23. The device according to claim 18, wherein the surface is a circular platen surface having a longitudinal axis through a center thereof for rotation thereabout.

24. A method for delivering a vaporized solid precursor to a CVD process chamber, the method comprising the steps of:
  providing a surface having a solid precursor material applied thereon;
  directing a focused thermal beam at the surface;
  rotating the surface and indexing one of the rotating surface and directed focused thermal beam relative to the other such that the directed beam is repetitively moved from impinging upon one path of solid precursor material to a next path of solid precursor material to vaporize the solid precursor material on the surface; and transporting the vaporized solid precursor material to the processing chamber.

25. The method according to claim 24, wherein the surface is a cylindrical surface rotated about a longitudinal axis therethrough with the paths extending about the longitudinal axis, and further wherein the indexing step includes indexing the cylindrical surface linearly along the longitudinal axis.

26. The method according to claim 24, wherein the surface is a cylindrical surface rotated about a longitudinal axis therethrough with the paths extending about the longitudinal axis, and further wherein the indexing step includes indexing the directed laser beam linearly across the cylindrical surface in a direction common with the longitudinal axis.

27. The method according to claim 24, wherein the surface is a circular platen surface rotated about a longitudinal axis through a center thereof with the paths extending about the longitudinal axis, and further wherein the indexing step includes indexing the focused thermal beam between an outer edge portion of the platen surface and the center of the circular platen surface.

28. The method according to claim 24, wherein the surface is positioned in a sealed interior volume and the focused thermal beam is focused through a quick change transparent window, and further wherein the method includes replacing the quick change transparent window.

29. The method according to claim 24, wherein the providing step includes the steps of:
making a solution of a solid precursor and a solvent;
coating the surface with the solution; and
removing the solvent from the solution coated on the surface.

30. The method according to claim 29, wherein the coating step includes one of spinning, spraying, pressing, and dipping.

31. The method according to claim 29, further including the step of roughening the surface.

32. The method according to claim 24, wherein the providing step includes the step of coating the surface by sublimation of the solid precursor material and condensation of the solid precursor material on the surface.

33. The method according to claim 32, further including the step of roughening the surface.

34. The method according to claim 24, further including the step of cooling the surface.

35. The method according to claim 24, further including the step of controlling a rate of vaporization as a function of the focused thermal beam power.

36. The method according to claim 24, further including the step of controlling a rate of vaporization as a function of a thickness of the solid precursor material uniformly coated on the surface.

37. A method for delivering a vaporized solid precursor to a CVD process chamber, the method comprising the steps of:
providing a cylindrical surface having a solid precursor material thereon and a longitudinal axis therethrough, the cylindrical surface positioned in a sealed volume;
directing a focused thermal beam at the cylindrical surface;
rotating the cylindrical surface about the longitudinal axis and moving one of the cylindrical surface and focused thermal beam relative to the other to continuously direct the focused thermal beam at a different contact area of the cylindrical surface to vaporize the solid precursor material; and
transporting the vaporized solid precursor material using a carrier gas from the sealed volume to the processing chamber.

38. The method according to claim 37, wherein the moving step includes moving the focused thermal beam linearly across the cylindrical surface in a direction common with the longitudinal axis.

39. The method according to claim 37, wherein the moving step includes moving the focused thermal beam between a first end and a second end of the cylindrical surface.

40. A method for delivering a vaporized solid precursor to a CVD process chamber, the method comprising the steps of:
providing a circular platen surface having a solid precursor material thereon and a longitudinal axis through the center thereof, the circular platen surface positioned in a sealed volume;
directing a focused thermal beam at the circular platen surface;
rotating the circular platen surface about the longitudinal axis and moving the focused thermal beam between an edge of the circular platen surface and the center of the circular platen surface to continuously direct the focused thermal beam at a different contact area of the circular platen surface to vaporize the solid precursor material; and
transporting the vaporized solid precursor material using a carrier gas from the sealed volume to the processing chamber.

* * * * *

UNITED STATES PATENT AND TRADEMARK OFFICE
CERTIFICATE OF CORRECTION

PATENT NO.: 5,674,574
DATED: October 7, 1997
INVENTOR(S): David R. Atwell and Donald L. Westmoreland It is certified that error appears in the above-identified patent and that said Letters Patent is hereby corrected as shown below:

Col. 3, line 31, delete "or the" and insert --of the--;

Col. 3, line 61, delete "step. then" and insert --step then--;

Col. 4, line 66, delete "acylindrically" and insert --a cylindrically--;

Col. 5, line 25, delete "position" and insert --positioned--;

Col. 6, line 14, delete "thought" and insert --through--;

Col. 9, line 45, delete "vaporized" and insert --vaporizes--;

Col. 10, line 10, delete "recognized" and insert --recognize--;

Col. 10, line 12, delete "are equally" and insert --is equally--.

Signed and Sealed this

Twenty-seventh Day of October, 1998

Attest:

BRUCE LEHMAN

*Attesting Officer*      *Commissioner of Patents and Trademarks*